United States Patent
Barge et al.

(10) Patent No.: US 7,029,993 B1
(45) Date of Patent: Apr. 18, 2006

(54) METHOD FOR TREATING SUBSTRATES FOR MICROELECTRONICS AND SUBSTRATES OBTAINED ACCORDING TO SAID METHOD

(75) Inventors: Thierry Barge, Grenoble (FR); André Auberton-Herve, St. Egreve (FR); Hiroji Aga, Annaka Gunma (JP); Naoto Tate, Annaka Gunma (JP)

(73) Assignee: S.O.I.Tec Silicon on Insulator Technologies S.A., Bernin (FR)

( * ) Notice: Subject to any disclaimer, the term of this patent is extended or adjusted under 35 U.S.C. 154(b) by 0 days.

(21) Appl. No.: 10/069,058

(22) PCT Filed: Aug. 17, 2000

(86) PCT No.: PCT/FR00/02330

§ 371 (c)(1),
(2), (4) Date: Aug. 27, 2002

(87) PCT Pub. No.: WO01/15215

PCT Pub. Date: Mar. 1, 2001

(30) Foreign Application Priority Data

Aug. 20, 1999 (FR) .................... 99 10667

(51) Int. Cl.
*H01L 21/302* (2006.01)
(52) U.S. Cl. .............. 438/475; 438/4; 438/974
(58) Field of Classification Search ............ 438/4, 438/406, 455–459, 471–477, 692, 795–799, 438/974–977; 117/2; 156/610
See application file for complete search history.

(56) References Cited

U.S. PATENT DOCUMENTS

| 5,374,564 | A | 12/1994 | Bruel ........................ 437/24 |
| 5,589,422 | A | 12/1996 | Bhat ......................... 437/228 |
| 6,020,252 | A | 2/2000 | Aspar et al. ............... 438/458 |
| 6,287,941 | B1* | 9/2001 | Kang et al. ................ 438/459 |
| 6,403,450 | B1 | 6/2002 | Maleville et al. .......... 438/471 |
| 6,429,104 | B1 | 8/2002 | Auberton-Herve ......... 438/527 |
| 6,531,416 | B1* | 3/2003 | Kobayashi et al. ........ 438/795 |
| 2002/0173872 | A1* | 11/2002 | Malik ........................ 700/164 |

FOREIGN PATENT DOCUMENTS

| DE | 197 53494 | 10/1998 |
| EP | 0 553 852 A | 8/1993 |
| EP | 0 917 188 A | 5/1999 |
| EP | 0 917 193 A | 5/1999 |
| FR | 2 681 472 A | 3/1993 |
| FR | 2 748 851 A | 11/1997 |

(Continued)

OTHER PUBLICATIONS

Sorab K. Ghandhi, VLSI Fabrication Principles : Silicon and Gallium Arsenide, 2$^{nd}$ ed., 1994, John Wiley & Sons, Inc., New York, pp. 726.*

(Continued)

*Primary Examiner*—Howard Weiss
*Assistant Examiner*—Marcos D. Pizarro
(74) *Attorney, Agent, or Firm*—Winston & Strawn LLP

(57) ABSTRACT

The invention relates to a method for treating substrates (50) for microelectronics or optoelectronics, whereby said substrates comprise a useful layer (52) on at least one of the surfaces thereof. The inventive method includes a mechanical/chemical polishing step occurring on a bare surface (54) of the useful layer and is characterized in that it also comprises a post-curing step in a reductive atmosphere (100) before said polishing step occurs.

22 Claims, 5 Drawing Sheets

FOREIGN PATENT DOCUMENTS

Figure 4:
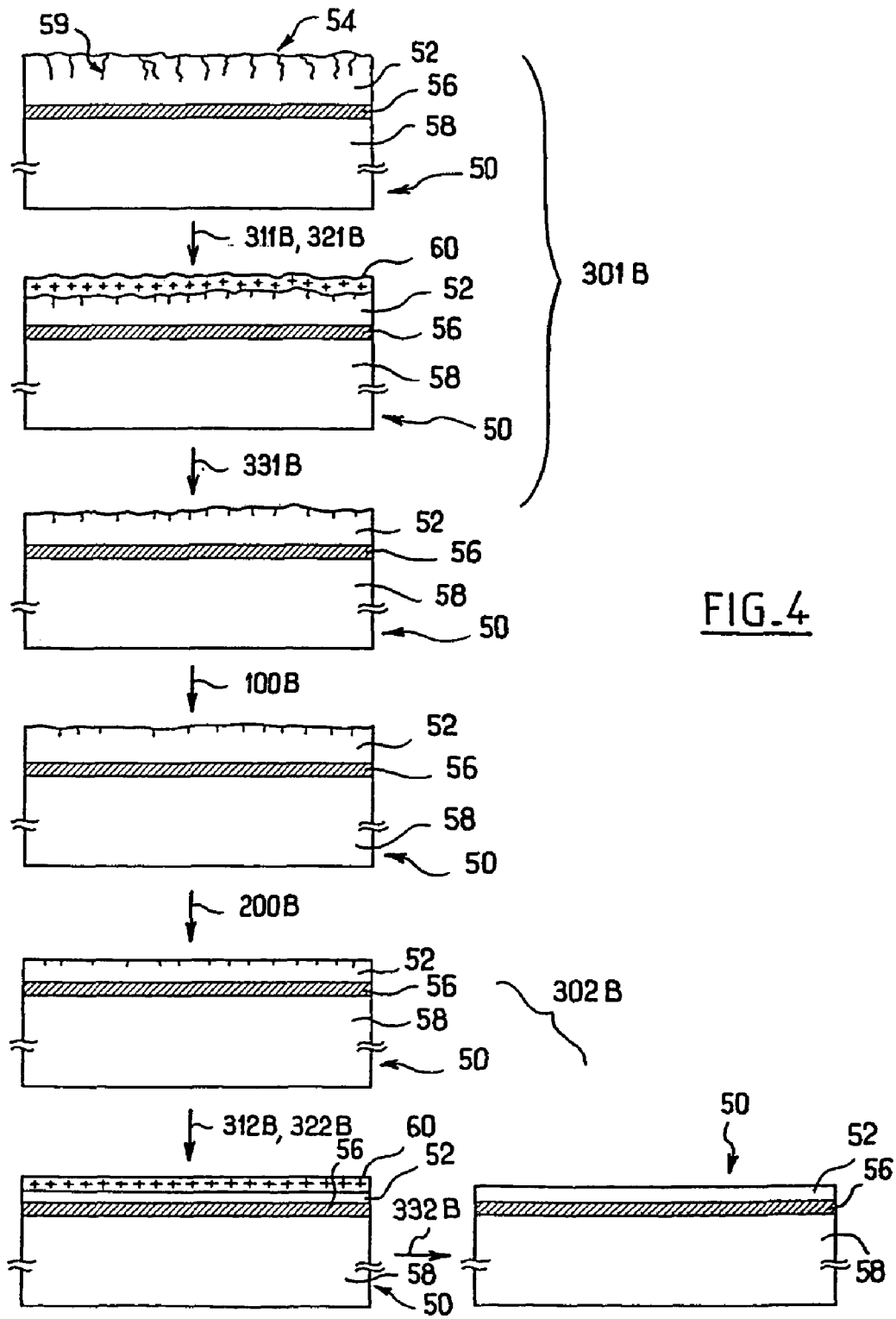

| | | |
|---|---|---|
| FR | 2 761 526 | 10/1998 |
| FR | 2 761 526 A | 10/1998 |
| FR | 2 762 136 | 10/1998 |
| FR | 2 774 510 A | 8/1999 |
| FR | 2 777 115 A | 10/1999 |
| JP | 5217821 | 8/1993 |
| JP | 10242154 | 9/1998 |

OTHER PUBLICATIONS

Peter Van Zant; Microchip fabrication : a practical guide to semiconductor processing; 4th ed.; 2000; McGrawHill, New York, pp. 63-64.*

Moriceau, H., et al., "Hydrogen Annealing Treatment Used to Obtain High Quality SOI Surfaces," *Annual IEEE International Silicon-on-insulator Conference*, vol. Conf. 24, pp. 37-38, New York (1998).

Maszara, W.P., et al., "Quality of SOI Film After Surface Smoothing With Hydrogen Annealing, Touch Polishing," *Proceedings of the 1997 IEEE International SOI Conference*, pp. 130-131, New York (1997).

Sato, N., et al., "Hydrogen Annealed Silicon-on-insulator," *Applied Physics Letters*, vol. 65, No. 15, pp. 1924-1926, New York (1994).

* cited by examiner

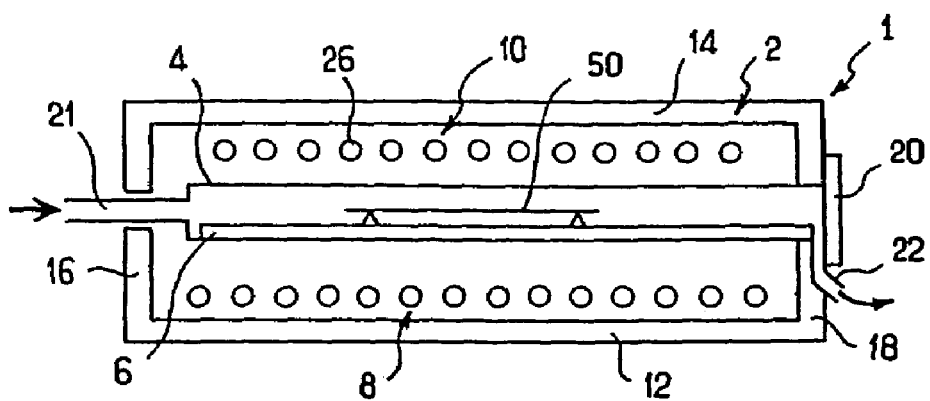
FIG_1
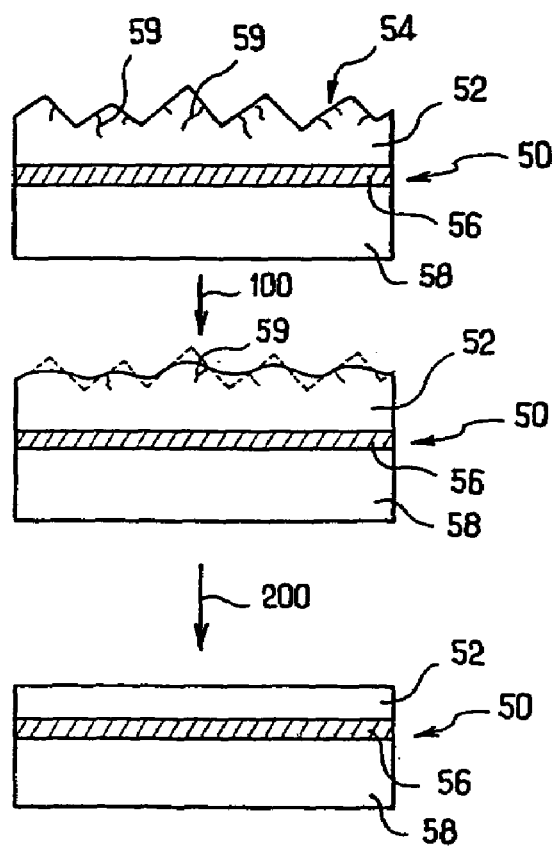
FIG_2

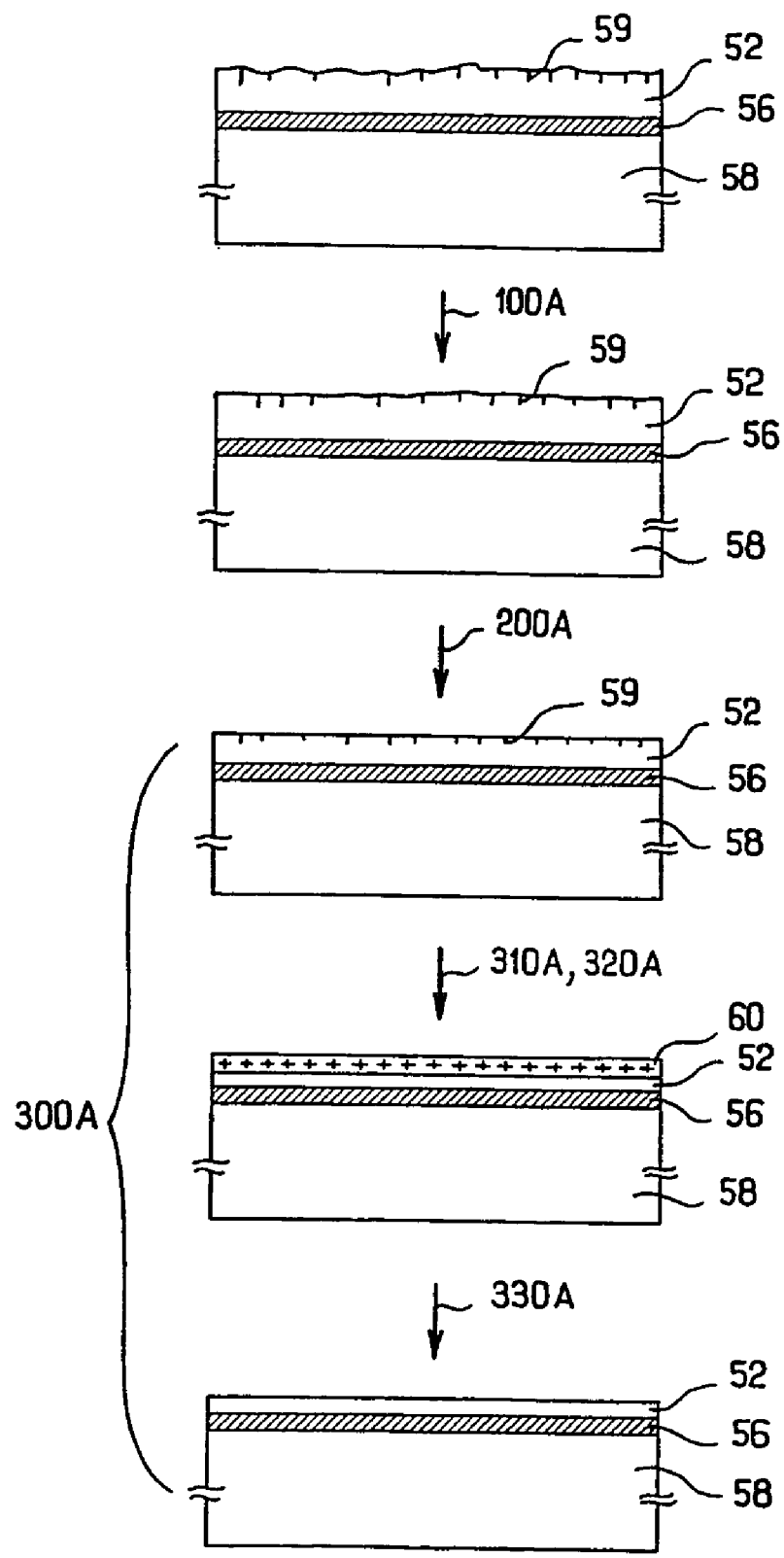
FIG_3

METHOD FOR TREATING SUBSTRATES FOR MICROELECTRONICS AND SUBSTRATES OBTAINED ACCORDING TO SAID METHOD

The invention relates to the field of processes for treating substrates intended for the manufacture of microelectronic and/or optoelectronic components.

The invention also relates to the substrates obtained by this process.

More specifically, the invention relates to the field of processes for treating substrates that are entirely semiconductors (for example silicon) or entirely insulators, or alternatively substrates that consist of a stack of semiconducting or insulating layers. These may be substrates onto which is deposited a layer (for example an epitaxial layer) or substrates comprising nonhomogeneous structures, such as substrates comprising components or parts of components at more or less advanced levels of their production.

There exists, to a certain depth from the surface of at least one face of these substrates, a layer of material which, at least partially, makes up the constitution of the components prepared on this face. This layer will be referred to hereinbelow by the expression "working layer".

The quality of this working layer conditions that of the components. Efforts are continually being made to improve the quality of this working layer. Thus, attempts are made both to reduce the surface roughness of this working layer and to reduce the concentration of defects in the thickness of this layer.

It is known that chemical-mechanical polishing methods can be used to reduce the surface roughness of the working layer.

It is also known that chemical-mechanical polishing techniques can be used to reduce the concentration of certain defects in the working layer, when a concentration gradient of these defects exists, increasing in the direction of the surface of this layer. In this case, the chemical-mechanical polishing abrades the working layer down as far as the zones, deeper than the initial surface of the working layer, which have an acceptable concentration of these defects.

However, it is also known that chemical-mechanical polishing causes a degradation of certain properties of the working layer and a reduction in the capacity to produce substrates (FR 2 762 136 and FR 2 761 526).

It has thus been proposed to replace chemical-mechanical polishing, in particular when the working layer consists of silicon, with an annealing operation in a hydrogen-containing atmosphere (FR 2 762 136 and FR 2 761 526). An annealing, under a hydrogen-containing atmosphere, of substrates comprising a working layer consisting of silicon has an effect of reducing the surface roughness, in particular by reconstructing the silicon surface, as well as a role of healing certain crystal defects.

One aim of the invention is to further improve the quality of the working layer.

This aim is achieved, according to the invention, by means of a process for treating substrates for the microelectronics or optoelectronics industry, comprising a working layer on at least one of their faces, this process comprising a step of chemical-mechanical polishing on the free surface of the working layer, characterized in that it also comprises a step of annealing under a reductive atmosphere, before the polishing step.

It is well known that chemical-mechanical polishing causes certain defects in the material lying underneath the polished surface and is liable to give rise to nonuniform thicknesses of the substrates, and in particular of the working layer.

However, surprisingly, the Applicant has found that by preceding the chemical-mechanical polishing step with an annealing operation under a reductive atmosphere, not only can the quality of the working layer be improved more effectively than by simple polishing or simple annealing, but also most of the harmful effects of a simple chemical-mechanical polishing are avoided. This is because the annealing operation under a reductive atmosphere has already begun to make the surface of the working layer smooth. The polishing time required to obtain a satisfactory roughness is thus reduced. As a result, the process according to the invention makes it possible to increase the production capacities. In addition, the reduction in the polishing time limits the negative effects of the polishing, such as those mentioned above, or the loss of uniformity of thickness which generally arises when the polishing lasts a long time.

Thus, the quality, in terms of roughness of the working layer, after carrying out the process according to the invention, is particularly advantageous.

The roughness measurements are generally carried out by means of an atomic force microscope. With this type of apparatus, the roughness is measured on areas scanned by the tip of the atomic force microscope, going from $1\times1$ $\mu m^2$ to $10\times10$ $\mu m^2$ and, more rarely, $50\times50$ $\mu m^2$ or even $100\times100$ $\mu m^2$. The roughness can be characterized, in particular, according to two modes. According to one of these modes, the roughness is said to be high-frequency roughness and corresponds to scanned areas of the order of $1\times1$ $\mu m^2$. According to another of these modes, the roughness is said to be low-frequency roughness and corresponds to scanned areas of the order of $10\times10$ $\mu m^2$, or more.

Chemical-mechanical polishing and annealing under a reductive atmosphere are distinguished by their effects on different ranges of frequencies. Thus, annealing under a reductive atmosphere promotes smoothing-out of the high-frequency roughness, but is less efficient for reducing the undulations, which are, rather, low-frequency. Chemical-mechanical polishing, on the other hand, makes it possible also to improve the low-frequency roughness.

By means of the process according to the invention, low high-frequency roughness can be obtained, by means of the annealing operation under a reductive atmosphere, and small undulations, i.e. a type of low-frequency roughness, can be obtained by means of the polishing operation. Now, low high-frequency roughness is fundamental for obtaining good screen oxides, and low undulation (low-frequency roughness) is advantageous when it is desired to bond another substrate to the free surface of the working layer.

In addition to its effect on roughness, the process according to the invention makes it possible to reduce the concentration of certain defects in the working layer. Specifically, the annealing operation under a reductive atmosphere makes it possible to begin reconstructing the surface of the working layer and to heal certain defects in the thickness of the working layer. However, this healing can only be partial. Nevertheless, if the chemical-mechanical polishing operation is continued for long enough, it allows removal of the material comprising a large proportion of the defects in the region of the free surface of the working layer and in the thickness of this working layer. The process according to the invention is thus particularly advantageous when there is an increasing concentration gradient in the direction of the free surface of the working layer, and a high concentration of defects in the region of this surface. The combined effect of healing the defects, by the annealing operation under a reductive atmosphere, and of removing material, by the polishing operation, allows a particularly effective removal of the defects in the region of the free surface of the working layer.

By means of the process according to the invention, a substrate is thus obtained with a working layer whose quality is sufficient and compatible with the use of this working layer in microelectronic or optoelectronic applications.

The reductive atmosphere advantageously comprises hydrogen. This reductive atmosphere also preferentially comprises argon.

Thus, the reductive atmosphere can be composed of 100% hydrogen. However, advantageously, the reductive atmosphere is composed of a mixture of hydrogen and argon. This mixture is preferentially in an $H_2/Ar$ ratio of 20/80 or of 25/75. With ratios of this type, the hydrogen is in a sufficient concentration to be significant, but, by virtue of the argon, the mixture is a better heat conductor. The enhancement of the heat-conducting properties of the mixture reduces the thermal constraints on the substrate. This results in a smaller generation of defects of sliding-band type. This type of mixture is also less corrosive, which results in a less selective attack of certain defects.

Advantageously also, the process according to the invention additionally comprises a sacrificial oxidation step. This sacrificial oxidation step comprises a step of oxidizing the working layer over at least a portion of its thickness and a step of deoxidizing this oxidized portion. The oxidation and deoxidation steps can be carried out after the polishing step and/or before it.

A sacrificial oxidation step is advantageously carried out to improve the quality of a working layer, whether the material constituting this working layer is a material which is readily oxidized or not readily oxidized. In the text hereinbelow, and in particular in the claims, a sacrificial oxidation step will be considered as achievable whether or not the material of the working layer is readily oxidized.

Each of the polishing and sacrificial oxidation steps participates in removing the portion of the working layer comprising an excessive concentration of defects. However, a sacrificial oxidation step, subsequent to the polishing step, more specifically participates in deleting the surface defects generated by the polishing step.

A sacrificial oxidation step also limits other deleterious effects of the polishing operation. Specifically, if a relatively thick layer of defects is present at the start, a long polishing time is required to remove it. However, a long polishing time generally results in a lack of thickness uniformity. This drawback is all the more critical the thicker the material to be removed and thus the longer the polishing step lasts. Furthermore, long polishing operations slow down the execution of the process and induce a limitation on the production capacity. By introducing a sacrificial oxidation step in the process according to the invention, these drawbacks are avoided by limiting the polishing operation essentially to that which is required to reduce the roughness, the sacrificial oxidation step contributing appreciably towards removing the part of the working layer comprising a high concentration of defects. Furthermore, by reducing the polishing required, the defects thereby generated may be developed on a smaller scale.

Advantageously also, the process according to the invention comprises at least one heat treatment step, the step of oxidizing the working layer being carried out before the end of each of these heat treatment steps, in order to protect the rest of the working layer. Under these conditions, the heat treatment can also at least partially heal the defects generated during the oxidation step.

Advantageously also, the process according to the invention additionally comprises a step of annealing under a reductive atmosphere after the polishing step.

Advantageously also, the process according to the invention comprises a step of implanting atoms under one face of a wafer, in an implantation zone, a step of placing the face of the wafer, which has undergone the implantation, in intimate contact with a support substrate, and a step of cleaving the wafer in the implantation zone, in order to transfer some of the wafer onto the support substrate and form a thin film or a thin layer thereon, this thin film or this thin layer constituting the working layer which is then subjected to the steps of annealing in hydrogen and of polishing.

Advantageously also, the process according to the invention is carried out on a substrate comprising a working layer consisting of a semiconductor material. This semiconductor material is, for example, silicon.

Advantageously also, and in particular if the working layer consists of silicon, the step of annealing under a reductive atmosphere is carried out according to a known procedure described, for example, in document FR 2 761 526. According to this procedure, the substrate is annealed at a temperature of between about 1050° C. and 1350° C., for a few tens of seconds to a few tens of minutes, under a hydrogen-containing atmosphere.

According to another advantageous variant of the process according to the invention, the step of annealing under a reductive atmosphere is carried out according to another known procedure described, for example, in document EP 917 188. According to this other procedure, the substrate is annealed, under a hydrogen-containing atmosphere, at a temperature of between about 1100° C. and 1300° C., in less than three minutes, preferably in less than 60 seconds and even more preferably in less than thirty seconds. This other procedure corresponds to a rapid annealing operation, also known as RTA annealing (RTA being the acronym for the expression Rapid Thermal Annealing).

The annealing operation can be carried out at constant temperature, at variable temperature, with temperature stages, or a combination of stages and variable ranges.

According to yet another advantageous variant of the process according to the invention, the step of annealing under a reductive atmosphere is carried out according to another known procedure described, for example, in document FR 2 761 526. According to this other procedure, the substrate is annealed in apparatus which produces a hydrogen plasma. The advantage of this type of annealing lies in the fact that the annealing temperature is low. This temperature is typically within a range from room temperature to about 600° C.

With a working layer consisting of silicon, whether the annealing step under a hydrogen-containing atmosphere is carried out in a long annealing operation, an annealing operation in a hydrogen plasma or carried out in an annealing operation of RTA type, it has several effects. These effects are:

a disintegration of the native oxide at the surface of the working layer;

an etching of the silicon ($SiH_2$ and $SiH_4$ being volatile), leading to a reduction in the average thickness of the working layer;

a healing of certain defects by dissolving the oxygen precipitates and other oxide walls capable of playing a stabilizing role on certain crystal defects; but also a smoothing and a reduction of the roughness of the surface of the working layer, with the appearance of terraces at the atomic scale.

In particular, the disintegration of the silicon oxides with hydrogen greatly facilitates the reorganization of the silicon atoms.

At the surface in particular, the silicon atoms, activated by the annealing operation under a hydrogen-containing atmosphere, migrate at the surface until they find themselves in an energy configuration corresponding to an increased stability. Thus, the silicon atoms present in excrescences have a tendency to migrate into cavities. In this way, the step of annealing under a hydrogen-containing atmosphere has a tendency to reduce the surface roughness.

As regards the healing of certain defects, the effect of dissolving the oxygen precipitates and other oxide walls is particularly advantageous in the case of defects known as "COPs" (the acronym for the expression Crystal Originated Particles). These "COP" defects are collections of lacunae which are of the order of a few hundred to a few thousand angstroms in size and whose oriented walls, which are oriented in crystal planes, are stabilized with oxides in a thickness of the order of not more than a few tens of angstroms. These "COP" defects appear in particular in CZ silicon.

According to another aspect, the invention is a substrate for the microelectronics or optoelectronics industry, comprising a working layer on at least one of its faces, this substrate having been obtained after a step of chemical-mechanical polishing on the free surface of the working layer, characterized in that it has also undergone a step of annealing under a reductive atmosphere, before the polishing step.

Figure 5:
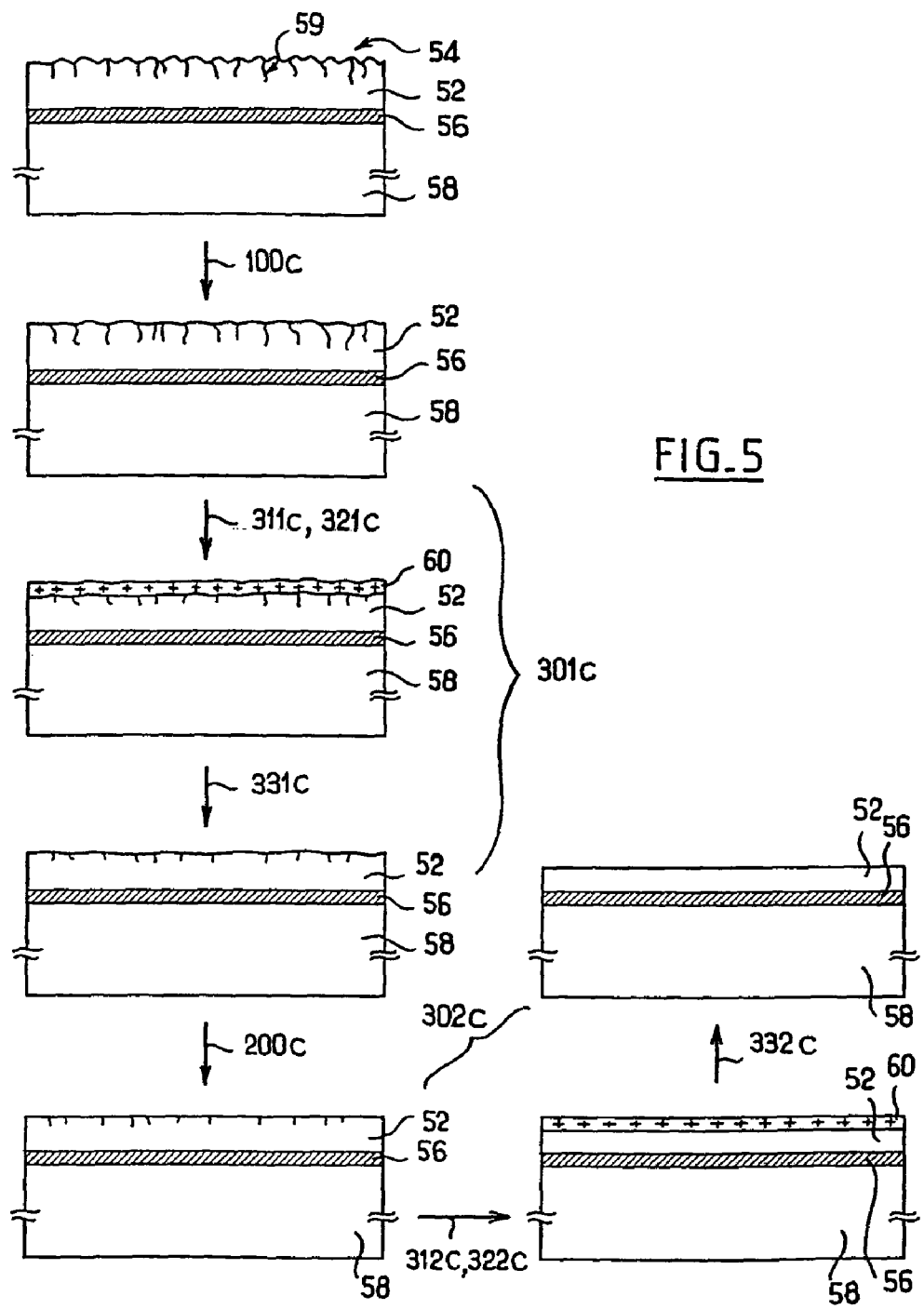
Figure 6:
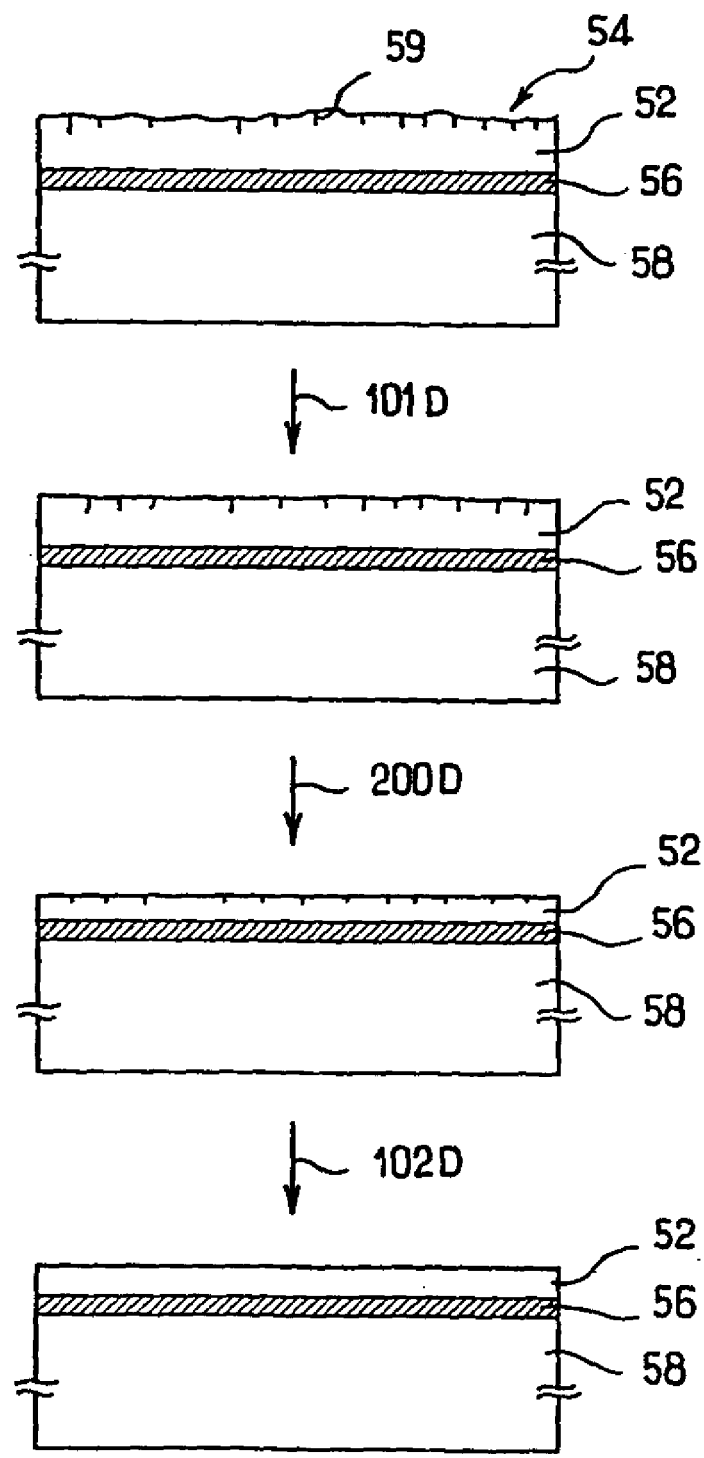

Other aspects, aims and advantages of the invention will become apparent on reading the detailed description which follows. The invention will also be better understood with the aid of the attached drawings, in which:

FIG. 1 diagrammatically shows, in longitudinal cross section, an example of a chamber for carrying out each step of annealing under a hydrogen-containing atmosphere, of the process according to the invention;

FIG. 2 diagrammatically shows, in cross section along a plane perpendicular to its main surfaces, a substrate in the course of its treatment by the process in accordance with the present invention;

FIG. 3 diagrammatically shows, in cross section along a plane perpendicular to its main surfaces, a substrate in the course of its treatment by a variant of the process in accordance with the present invention;

FIG. 4 diagrammatically shows, in cross section along a plane perpendicular to its main surfaces, a substrate in the course of its treatment by another variant of the process in accordance with the present invention;

FIG. 5 diagrammatically shows, in cross section along a plane perpendicular to its main surfaces, a substrate in the course of its treatment by yet another variant of the process in accordance with the present invention; and FIG. 6 diagrammatically shows, in cross section along a plane perpendicular to its main surfaces, a substrate in the course of its treatment by yet another variant of the process in accordance with the present invention.

Five embodiments of the process in accordance with the present invention are described below, as detailed examples.

These five embodiments are illustrated below as examples, but without any limiting nature, in the context of the manufacture of silicon on insulator substrates. The silicon on insulator substrates are also referred to as SOI substrates.

In this context, the process according to the invention finds a particularly advantageous application in the manufacture of SOI substrates by processes of a particular type, known as SMART-CUT® processes.

One particular way of carrying out a SMART-CUT® process is described in patent FR 2 681 472.

In the context of the manufacture of SOI substrates, a SMART-CUT® process produces substrates comprising a working layer 52 consisting of silicon on one face thereof, this silicon layer resting on a layer of insulator, also known as the layer of buried oxide 56.

According to one of its variants, the SMART-CUT® process comprises:

a step of implanting atoms, under one face of a semiconductor wafer, in an implantation zone;

a step of placing the wafer subjected to the implantation in intimate contact with a support substrate; and a step of cleaving the wafer in the implantation zone, in order to transfer the portion of the wafer located between the surface subjected to the implantation and the implantation zone, onto the said support substrate and to form a thin film, or a layer, of silicon thereon.

The expression "implanting atoms" means any bombardment of atomic or ionic species which is capable of introducing these species into a material, with a concentration maximum for these species in this material, this maximum being located at a given depth relative to the bombarded surface. The atomic or ionic species are introduced into the material with an energy also distributed around a maximum. The implantation of the atomic species into the material can be carried out by means of an ion-beam implanter, a plasma-immersion implanter, etc.

The term "cleavage" means any fracture of the implanted material at the concentration maximum, in this material, of the implanted species or in the region of this maximum. This fracture does not necessarily occur along a crystallographic plane of the implanted material.

Several approaches may be envisaged to prepare an SOI substrate according to the SMART-CUT® process.

According to a first approach, a silicon wafer is covered on its implantation face with a layer of insulating oxide (for example by oxidation of the silicon), and a support substrate, for example one also made of silicon, is used for the transfer.

According to a second approach, a layer which is entirely made of semiconductor (of silicon) is transferred either onto a support substrate covered with a layer of insulator or onto a support substrate which is entirely made of insulator (for example quartz).

According to a third approach, a layer covered with an insulating layer is transferred either onto a support substrate also covered with insulator, or onto a support substrate which is entirely made of insulator.

After cleavage and transfer, an SOI substrate 50 with a layer transferred onto one face of the support substrate is obtained in all cases, the free surface of this layer corresponding to a cleavage surface. After cleavage, the substrate 50 is freed of dust, cleaned and rinsed according to the usual techniques used in microelectronics.

In this case, it is advantageous to use the process according to the invention to reduce the roughness of the said free surface and the density of defects in the transferred layer.

According to the process in accordance with the present invention, the SOI substrate 50 undergoes a step of annealing under a reductive atmosphere 100 and a polishing step 200.

For all the embodiments described below, the step of annealing under a reductive atmosphere is carried out according to the RTA procedure described above.

An example of a chamber for carrying out a step of annealing under a reductive atmosphere 100, according to the RTA procedure, is illustrated in FIG. 1.

This chamber 1 comprises an enclosure 2, a reactor 4, a substrate-holder wafer 6, two arrays of halogen lamps 8, 10 and two pairs of side lamps.

The enclosure 2 in particular comprises a bottom wall 12, a top wall 14 and two side walls 16, 18, respectively located at the longitudinal ends of the enclosure 2. One of the side walls 16, 18 comprises a door 20.

The reactor 4 consists of a quartz tube extending longitudinally between the two side walls 16, 18. Each of these side walls 16, 18, respectively, is fitted with a gas inlet 21 and a gas outlet 22. The gas outlet 22 is on the side of the side wall 18 comprising the door 20.

Each array of halogen lamps 8, 10 is respectively located above and below the reactor 4, between this reactor and the bottom 12 and top 14 walls. Each array of halogen lamps 8, 10 comprises 17 lamps 26 arranged perpendicular to the longitudinal axis of the reactor 4. The two pairs of side lamps (not represented in FIG. 1) are located parallel to the longitudinal axis of the reactor 4, each on one side of this reactor, globally at the longitudinal ends of the lamps 26 of the arrays of halogen lamps 8, 10.

The substrate-holder wafer 6 slides in the reactor 4. It supports the substrates 50 which are intended to undergo the step of annealing under a hydrogen-containing atmosphere 100 and allows them to be placed in or removed from the chamber 1.

A chamber 1 of this type is sold by STEAG® under the name "SHS AST 2800".

The five embodiments of the process according to the invention, described below, are applied to the treatment of SOI substrates 50 comprising a working layer 52 itself having a free surface 54. This free surface 54 is a cleavage surface obtained, as described above, by carrying out a SMART-CUT® process. Under the working layer 52, the substrate 50 comprises a layer of buried oxide 56. Under the layer of buried oxide 56, the substrate 50 comprises a support substrate 58.

The parameters given for the five embodiments of the process according to the invention, which will be described below, correspond to "fine product" applications. These "fine products" are SOI substrates whose silicon on insulator layer, i.e. the working layer 52, is about 2000 Å thick, whereas the layer of buried insulator 56 is about 4000 Å thick. To prepare SOI substrates having a thicker working layer 52 and/or a thicker layer of buried oxide, an implantation operation at higher energy will be carried out, in order for the layer of atomic species implanted to be located deeper down than the bombarded surface. In this case, it will also have to be taken into account that the deeper the atomic species are implanted, the more material it will be necessary to remove after cleavage, in order to regain an acceptable concentration of defects in the working layer 52. The reason for this is that the deeper the atomic species are implanted, the more the width of the defective zone increases.

According to the first embodiment, represented in FIG. 2, a substrate 50 is subjected, after the cleavage step of the SMART-CUT® process described above and a cleaning operation, to a step of annealing under a reductive atmosphere 100, and then to a step of chemical-mechanical polishing 200.

Before these two steps, the concentration of defects 59 in the working layer 52, in the region of the free surface 54, and the roughness of this surface are unsatisfactory.

The step of annealing under a reductive atmosphere 100 is carried out according to the RTA-type procedure described above.

The step of annealing under a reductive atmosphere consists in:
- placing the substrate 50 in a chamber 1 such as the one described above, this chamber being cold when the substrate 50 is introduced;
- introducing, at a pressure equal to or in the region of atmospheric pressure, a mixture of hydrogen and argon, in proportions by volume of 25% hydrogen to 75% argon;
- increasing, by lighting the halogen lamps 26, the temperature in the chamber 1, at a rate of about 50° C. per second, up to a treatment temperature;
- keeping the substrate 50 in the chamber 1, for 20 seconds, at the treatment temperature, this treatment temperature advantageously being chosen between 1200° C. and 1230° C. and preferably being equal to 1230° C.; and
- switching off the halogen lamps 26 and cooling, by circulation of air, the substrate 50, at a rate of several tens of degrees centigrade per second and varying according to the temperature range.

Under these conditions, with rapid heating and cooling ramps, and a short steady stage, this annealing operation under a reductive atmosphere 100 reduces the roughness virtually without removing material. The thickness of material removed is less than 20 Å. The reduction in the roughness is essentially achieved by surface reconstruction and smoothing rather than by etching. In addition, the crystal defects 59 in the silicon of the working layer 52, generated during the implantation and cleavage operations, are at least partly healed by this annealing operation under a reductive atmosphere 100. The concentration of these defects 59, in the working layer 52, is thus reduced. Consequently, the thickness of working layer 52, over which the concentration of defects 59 is too great to be acceptable, is reduced. Furthermore, the fact that this annealing operation is performed under a reductive atmosphere 100, according to the RTA procedure, prevents propagation of the attack of certain defects down as far as the layer of buried oxide 56.

The annealing step under a reductive atmosphere 100 described above offers many other advantages. It is readily compatible with a high production capacity for the substrates 50, is easy to use, can be carried out with already-existing equipment, etc.

The roughness is generally expressed either in terms of the difference between the minimum height and the maximum height measured during scanning of the surface whose roughness is measured, or by means of a root mean square (rms) value. The difference between the minimum and maximum heights will be denoted hereinbelow by "P-V" (from the term "Peak-Valley").

After the step of annealing under a reductive atmosphere 100, the roughness measured during scanning of a 1×1 µm² area is reduced from 50 to 1–1.5 Å rms (i.e. from a value of greater than 500 Å to about 20 Å, in P-V values), and the roughness measured during scanning of a 10×10 µm² area is reduced from 50 to 5–15 Å rms (i.e. from a value of greater than 500 Å to 40–50 Å in P-V value).

The polishing step 200 is carried out by a conventional chemical-mechanical polishing operation known to those skilled in the art. Starting with a surface which has already been made quite smooth by the step of annealing under a reductive atmosphere 100, a polishing step 200 on a thickness of 200 to 400 Å only is sufficient to bring the roughness, and more particularly the low-frequency roughness, to a satisfactory value. Typically, the roughness after polishing is from about 0.8 to 1.5 Å rms, if this measurement is carried out during scanning of a 1×1 μm² area, or from about 1 to 2 Å rms if this measurement is carried out during scanning of a 10×10 μm² area.

This polishing step 200 also makes it possible to remove from the working layer 52 the material lying close to the free surface 54 and comprising defects 59.

The second embodiment of the process according to the invention is represented in FIG. 3. By way of example, as previously, it is carried out on a substrate 50 of SOI type obtained after the cleavage step of the SMART-CUT® process described above and a cleaning operation.

According to this second embodiment, the substrate 50 is subjected to an annealing step under a reductive atmosphere 100A, then to a chemical-mechanical polishing step 200A and finally to a sacrificial oxidation step 300A combined with a heat treatment 320A.

The steps of annealing under a reductive atmosphere 100A and of chemical-mechanical polishing 200A in this embodiment are identical to those described for the first embodiment.

The sacrificial oxidation step 300A is intended to remove the defects 59 remaining after the polishing step 200A. These defects 59 may arise from the implantation, from the cleavage, or may have been generated during the polishing step 200A, etc.

The sacrificial oxidation step 300A is made up of an oxidation step 310A and a deoxidation step 330A. The heat treatment 320A comes between the oxidation step 310A and the deoxidation step 330A.

The oxidation step 310A is preferably carried out at a temperature of between 700° C. and 1100° C. The oxidation step 310A can be carried out via a dry route or a wet route. Via a dry route, the oxidation step 310A is carried out, for example, by heating the substrate 50 under oxygen gas. Via a wet route, the oxidation step 310A is carried out, for example, by heating the substrate 50 under an atmosphere charged with water vapor. Via a wet or dry route, according to conventional processes known to those skilled in the art, the oxidative atmosphere can also be charged with hydrochloric acid.

The oxidation step 310A results in the formation of an oxide 60.

The heat treatment step 320A is carried out by any thermal operation intended to improve the qualities of the material constituting the working layer 52. This heat treatment 320A can be carried out at constant temperature or at variable temperature. In the latter case, the heat treatment 320A is carried out, for example, with a gradual increase of the temperature between two values, or with a cyclic oscillation between two values, etc.

The heat treatment step 320A is preferably carried out at least partly at a temperature above 1000° C. and more particularly at about 1100–1200° C.

The heat treatment step 320A is preferably carried out under a nonoxidative atmosphere. The atmosphere for the heat treatment 320A can comprise argon, nitrogen, hydrogen, etc., or alternatively a mixture of these gases. The heat treatment 320A can also be carried out under vacuum.

Preferably also, the oxidation step 310A is carried out before the heat treatment step 320A. In this way, the oxide 60 protects the rest of the working layer during the heat treatment 320A and prevents the phenomenon of pitting. The phenomenon of pitting is well known to those skilled in the art. It occurs at the surface of certain semiconductors when they are annealed under a nonoxidative atmosphere, such as nitrogen, argon, under vacuum, etc. It occurs in the case of silicon in particular when the latter is laid bare, i.e. when it has no oxide coat at all.

According to one advantageous variant, the oxidation step 310A begins with the start of the temperature increase of the heat treatment 320A and finishes before the end of this heat treatment.

The heat treatment 320A makes it possible to heal, at least partly, the defects generated during the preceding steps of the process for manufacturing and treating the substrate 50. More particularly, the heat treatment 320A can be carried out for a time and at a temperature such that crystal defects are thereby healed, such as stacking faults, "HF" defects, etc., generated in the working layer 52 during the oxidation step 310A. The term "HF" defect refers to a defect whose presence is revealed by a decorative halo in the buried oxide 56, after treating the substrate 50 in a hydrofluoric acid bath.

The heat treatment 320A also has the advantage of reinforcing the bonding interface, for example between the layer transferred during the transfer by the SMART-CUT® process and the support substrate 58.

The deoxidation step 330A is preferably carried out in solution. This solution is, for example, a 10% or 20% hydrofluoric acid solution. A few minutes suffice to remove from one thousand to several thousand angstroms of oxide 60, by immersing the substrate 50 in such a solution.

During this second embodiment of the process according to the invention, the following will be removed:
  at least 15 Å of silicon from the working layer 52, during the step of annealing under a reductive atmosphere 100,
  300 Å of silicon from the working layer 52, during the polishing step 200, and
  650 Å of silicon from the working layer 52, during the sacrificial oxidation step 300.

The total thickness of working layer 52 removed during the process according to the invention, in this second embodiment, is equal to about 950 Å. In general, the second embodiment of the process according to the invention will advantageously make it possible to remove 800 to 1100 Å.

Table 1 collates the roughnesses measured after the various steps of the second embodiment of the process according to the invention.

TABLE 1

Roughnesses measured after the various steps of the second embodiment of the process according to the invention.

| | 1 × 1 μm² area scanned | | 10 × 10 μm² area scanned | |
|---|---|---|---|---|
| | P-V roughness (Å) | rms roughness (Å) | P-V roughness (Å) | rms roughness (Å) |
| After cleavage | 500/1000* | 50/100* | 500/1000* | 50/100* |
| After the step of annealing under a reductive atmosphere 100 | 10/30 | 1–1.5 | 40–50 | 5–15 |

TABLE 1-continued

Roughnesses measured after the various steps of the second embodiment of the process according to the invention.

| | 1 × 1 µm² area scanned | | 10 × 10 µm² area scanned | |
|---|---|---|---|---|
| | P-V roughness (Å) | rms roughness (Å) | P-V roughness (Å) | rms roughness (Å) |
| After the polishing step 200 | 10 | 0.8–1.5 | 10 | 1–2 |
| After the sacrificial oxidation step 300 | 10 | 0.8–1.5 | 10 | 1–2 |

*After cleavage, the surface is so rough that the roughness cannot be measured significantly with an atomic force microscope.

The third embodiment of the process according to the invention is represented in FIG. 4. By way of example, and as for the preceding embodiments, it is carried out on a substrate 50 of SOI type obtained after the cleavage step of the SMART-CUT® process described above and a cleaning operation.

After the cleavage step and a cleaning operation, the substrate 50 is subjected to:
  a first sacrificial oxidation step 301B combined with a heat treatment 321B,
  a step of annealing under a reductive atmosphere 100B,
  a chemical-mechanical polishing step 200B, and
  a second sacrificial oxidation step 302B combined with a heat treatment 322B.

The steps of annealing under a reductive atmosphere 100B and of chemical-mechanical polishing 200B in this embodiment are identical to those described for the first embodiment described above.

The first and second sacrificial oxidation steps 301B, 302B are made up, like the sacrificial oxidation step 300A described above, of an oxidation step 311B, 312B and a deoxidation step 331B, 332B. The first and second sacrificial oxidation steps 301B, 302B, and the heat treatment steps 321B, 322B, are similar to those already described for the second embodiment, described above, of the process in accordance with the present invention.

During this third embodiment of the process according to the invention, the following will be removed:
  650 Å of silicon from the working layer 52, during the first sacrificial oxidation step 301B,
  less than 15 Å of silicon from the working layer 52, during the step of annealing under a reductive atmosphere 100B,
  300 Å of silicon from the working layer 52, during the polishing step 200B, and
  650 Å of silicon from the working layer 52, during the second sacrificial oxidation step 302B.

The total thickness of working layer removed during the process according to the invention, in this third embodiment, is equal to about 1600 Å.

Table 2 collates the roughnesses measured after the various steps of the second embodiment of the process according to the invention.

TABLE 2

Roughnesses measured after the various steps of the third embodiment of the process according to the invention.

| | 1x1 µm² area scanned | | 10x10 µm² area scanned | |
|---|---|---|---|---|
| | P-V roughness (Å) | rms roughness (Å) | P-V roughness (Å) | rms roughness (Å) |
| After cleavage | 500–1000* | 50–100* | 500–1000* | 50/100* |
| After the first sacrificial oxidation step 301B | 250–500 | 25–50 | 300–600 | 30–60 |
| After the step of annealing under a reductive atmosphere 100B | 20 | 1–1.5 | 40–50 | 5–10 |
| After the polishing step 200B | 10 | 0.8–1.5 | 10 | 1–2 |
| After the second sacrificial oxidation step 302B | 10 | 0.8–1.5 | 10 | 1–2 |

*After cleavage, the surface is so rough that the roughness cannot be measured significantly with an atomic force microscope.

The fourth embodiment is represented in FIG. 5. By way of example, and as for the preceding embodiments, it is carried out on a substrate 50 of SOI type obtained after the cleavage step of the SMART-CUT® process described above.

After the cleavage step and a cleaning operation, the substrate 50 is subjected to:
  a step of annealing under a reductive atmosphere 100C,
  a first sacrificial oxidation step 301C combined with a heat treatment 321C,
  a chemical-mechanical polishing step 200C, and
  a second sacrificial oxidation step 302C combined with a heat treatment 322C.

The steps of annealing under a reductive atmosphere 100C and of chemical-mechanical polishing 200C in this embodiment are identical to those described for the first embodiment described above.

The first and second sacrificial oxidation steps 301C, 302C are made up, as for the sacrificial oxidation step 300A described above, of an oxidation step 311C, 312C and a deoxidation step 331C, 332C.

The first and second sacrificial oxidation steps 301C, 302C, and the heat treatment steps 321C, 322C, are similar to those already described for the second embodiment, described above, of the process in accordance with the present invention.

During this fourth embodiment of the process according to the invention, the following will be removed:
  less than 15 Å of silicon from the working layer 52, during the step of annealing under a reductive atmosphere 100C,
  650 Å of silicon from the working layer 52, during the first sacrificial oxidation step 301C, 300 Å of silicon from the working layer 52, during the polishing step 200C, and 650 Å of silicon from the working layer 52, during the second sacrificial oxidation step 302C.

The total thickness of working layer 52 removed during the process according to the invention, in this fourth embodiment, is equal to about 1600 Å.

Table 3 collates the roughnesses measured after the various steps of the fourth embodiment of the process according to the invention.

TABLE 3

Roughnesses measured after the various steps of the fourth embodiment of the process according to the invention.

| | 1x1 μm² area scanned | | 10x10 μm² area scanned | |
|---|---|---|---|---|
| | P-V roughness (Å) | rms roughness (Å) | P-V roughness (Å) | rms roughness (Å) |
| After cleavage | 500–1000* | 50–100* | 500–1000* | 50–100* |
| After the step of annealing under a reductive atmosphere 100C | 10–30 | 1–1.5 | 40–50 | 5–15 |
| After the first sacrificial oxidation step 301C | 10–30 | 1–1.5 | 40–50 | 5–15 |
| After the polishing step 200C | 10 | 0.8–1.5 | 10 | 1–2 |
| After the second sacrificial oxidation step 302C | 10 | 0.8–1.5 | 10 | 1–2 |

*After cleavage, the surface is so rough that the roughness cannot be measured significantly with an atomic force microscope.

The fifth embodiment is represented in FIG. 6. By way of example, and as for the preceding embodiments, it is carried out on a substrate 50 of SOI type obtained after the cleavage step of the SMART-CUT® process described above.

After the cleavage step and a cleaning operation, the substrate 50 is subjected to:

a first step of annealing under a reductive atmosphere 101D, a chemical-mechanical polishing step 200D, and a second step of annealing under a reductive atmosphere 102D.

The steps of annealing under a reductive atmosphere 101D, 102D and of chemical-mechanical polishing 200D in this embodiment are identical to those described for the first embodiment.

During this fifth embodiment of the process according to the invention, the following will be removed:

less than 15 Å of silicon from the working layer 52, during the first step of annealing under a reductive atmosphere 101D, 400 Å of silicon from the working layer 52, during the polishing step 200D, and less than 15 Å of silicon from the working layer 52, during the second step of annealing under a reductive atmosphere 102D.

The total thickness of working layer 52 removed during the process according to the invention, in this fifth embodiment, is equal to about 400 Å.

According to one variant of this fifth embodiment of the process according to the invention, a heat treatment such as those already described or alternatively a sacrificial oxidation combined with a heat treatment, such as those also described above, can be inserted into the fifth embodiment described above.

Table 4 collates the roughnesses measured after the various steps of the fifth embodiment of the process according to the invention.

TABLE 4

Roughnesses measured after the various steps of the fifth embodiment of the process according to the invention.

| | 1x1 μm² area scanned | | 10x10 μm² area scanned | |
|---|---|---|---|---|
| | P-V roughness (Å) | rms roughness (Å) | P-V roughness (Å) | rms roughness (Å) |
| After cleavage | 500–1000* | 50–100* | 500–1000* | 50–100* |
| After the first step of annealing under a reductive atmosphere 101D | 10–30 | 1–1.5 | 40–50 | 5–15 |
| After the polishing step 200D | 10 | 0.8–1.5 | 10 | 1–2 |
| After the second step of annealing under a reductive atmosphere 102D | 10 | 0.8–1.5 | 10 | 1–2 |

*After cleavage, the surface is so rough that the roughness cannot be measured significantly with the atomic force microscope.

This fifth embodiment of the process according to the invention is particularly advantageous when the surface roughness after cleavage is reduced. This is the case in particular when the implantation is carried out with several energies (FR 2 774 510) and/or with several atomic species or alternatively when the cleavage is accompanied by mechanical constraints (FR 2 748 851).

What is claimed is:

1. A process for treating microelectronic or optoelectronic substrates that have a working layer with a free surface thereof, which process comprises:

oxidizing the working layer to provide at least a portion of the free surface as an oxide;

removing a portion of said oxide; and after the portion of said oxide is removed, annealing the substrate under a reductive atmosphere to assist in smoothing of the free surface and then chemical mechanical polishing the free surface to prepare it for further processing, wherein chemical mechanical polishing removes about 200 Å to about 400 Å of the substrate.

2. The process of claim 1, wherein the reductive atmosphere comprises hydrogen or a mixture of hydrogen and argon.

3. The process of claim 1, wherein the annealing is conducted for less than 60 seconds at a temperature between 1200 and 1230° C.

4. The process of claim 1, which further comprises conducting one or more heat treatments of the substrates as the further processing.

5. The process of claim 1, which further comprises oxidizing the working layer after polishing to provide at least a portion of the free surface as an oxide.

6. The process of claim 1, which further comprises annealing the substrates after the polishing step in order to improve qualities of the working layer.

7. The process of claim 1, wherein the working layer is provided by implanting atoms into a wafer to form a weakened atom implantation zone that defines the working layer, bonding the wafer to the substrate and then detaching the working layer from the wafer along the weakened zone to transfer it to the substrate.

8. The process of claim 7, wherein the working layer is made of a semiconductor material.

9. The process of claim 7, wherein the working layer is made of silicon.

10. A process for treating microelectronic or optoelectronic substrates that have a working layer with a free surface thereof, which process comprises annealing the substrate under a reductive atmosphere that includes hydrogen for less than 3 minutes at a temperate between 1100 and 1300° C. to assist in smoothing of the free surface, followed by chemical mechanical polishing of the free Surface to provide it with a final rms roughness of between 0.8 and 1.5 angstroms measured during scanning of a 1×1 μm area so that it is ready for further processing.

11. The process of claim 10, wherein the reductive atmosphere comprises hydrogen or a mixture of hydrogen and argon.

12. The process of claim 10, wherein the annealing is conducted for less than 60 seconds at a temperature between 1200 and 1230° C.

13. The process of claim 10, which further comprises conducting one or more heat treatments of the substrates as the further processing.

14. The process of claim 10, which further comprises annealing the substrates after the polishing step in order to improve qualities of the working layer.

15. The process of claim 10, wherein chemical mechanical polishing removes about 200 Å to about 400 Å of the substrate.

16. The process of claim 10, which further comprises oxidizing the working layer prior to polishing to provide at least a portion of the free surface as an oxide.

17. The process of claim 16, which further comprises removing a portion of the oxide prior to annealing.

18. The process of claim 10, which further comprises oxidizing the working layer after polishing to provide at least a portion of the free surface as an oxide.

19. The process of claim 18, wherein the oxidizing is carried out to form a protective oxide on the working layer and which further comprises subjecting the substrates to at least one further heat treatment as the further processing while the working layer is protected by the oxide.

20. The process of claim 10, wherein the working layer is provided by implanting atoms into a wafer to form a weakened atom implantation zone that defines the working layer, bonding The wafer to the substrate and then detaching the working layer from the wafer along the weakened zone to transfer it to the substrate.

21. The process of claim 20, wherein the working layer is made of a semiconductor material.

22. The process of claim 20, wherein the working layer is made of silicon.

* * * * *